United States Patent [19]

Vora et al.

[11] Patent Number: 4,628,339
[45] Date of Patent: Dec. 9, 1986

[54] POLYCRYSTALLINE SILICON SCHOTTKY DIODE ARRAY

[75] Inventors: Madhukar B. Vora, Los Gatos; Hemraj K. Hingarh, San Jose, both of Calif.

[73] Assignee: Fairchild Camera & Instr. Corp., Cupertino, Calif.

[21] Appl. No.: 794,586

[22] Filed: Nov. 4, 1985

Related U.S. Application Data

[60] Continuation of Ser. No. 537,136, Sep. 29, 1983, which is a division of Ser. No. 233,348, Feb. 11, 1981.

[51] Int. Cl.[4] ............... H01L 29/48; H01L 27/12; H01L 27/10; H01L 29/04
[52] U.S. Cl. .............................. 357/15; 357/4; 357/49; 357/59; 357/67; 357/71; 357/90
[58] Field of Search ............ 357/59, 15, 4, 49, 90, 357/67, 71

[56] References Cited

U.S. PATENT DOCUMENTS

| | | | |
|---|---|---|---|
| 4,220,961 | 9/1980 | Werner | 357/59 |
| 4,392,150 | 7/1983 | Correges | 357/715 |
| 4,400,713 | 8/1983 | Bauge et al. | 357/15 |

Primary Examiner—Martin H. Edlow
Assistant Examiner—Jerome Jackson, Jr.
Attorney, Agent, or Firm—David Carroll; Ronald C. Fish; Carl Silverman

[57] ABSTRACT

A process and structure are disclosed which are suitable for forming large arrays of Schottky diodes at desired locations between mutually perpendicular strips of aluminum and strips of metal-silicide. The invention is particularly useful in creating read-only memories and programmable logic arrays, and allows fabrication of Schottky diodes more compactly than previous structures.

22 Claims, 9 Drawing Figures

POLYCRYSTALLINE SILICON SCHOTTKY DIODE ARRAY

This is a continuation of application Ser. No. 537,136, filed Sept. 29, 1983, which is a division of application Ser. No. 233,348, filed Feb. 11, 1981.

BACKGROUND OF THE INVENTION

1. Field of the Invention

This invention relates to Schottky diodes, and in particular to a polycrystalline silicon Schottky diode array of particular utility for use in fabricating read only memories and programmable logic arrays.

2. Prior Art

Schottky diodes are typically fabricated in monocrystalline silicone together with other electronic components, for example, transistors. In such prior art structures, an N conductivity type buried layer typically has been the diode cathode. Unfortunately, the resulting diodes have high resistance and buried layer to substrate capacitance. Schottky diodes have also been fabricated on polycrystalline silicone. One such approach is described in our copending U.S. patent application Ser. No. 227,837, filed Jan. 23, 1981, and entitled "Low Resistance Schottky Diode on Polysilicon/Metal-Silicide". According to that approach, a plurality of diodes may be fabricated in a single strip of polycrystalline silicon by forming regions of metal over the polycrystalline silicon. A cathode pick-up serves to connect between the surface of the structure and an underlying region connected to the cathodes of the diodes. One disadvantage of the invention described in the above-referenced patent application is the large amount of wafer surface area required for the fabrication of each diode.

SUMMARY OF THE INVENTION

This invention provides a technique for fabricating large arrays of Schottky diodes on an insulating substrate. The invention is advantageous because the diodes formed are self-aligned, thereby utilizing far less surface area than presently existing structures.

According to one embodiment of the invention, a process for fabricating an array of Schottky diodes comprises the steps of depositing a layer of a metal-silicide on an underlying dielectric layer; depositing a layer of polycrystalline silicon on the layer of metal-silicide; removing selected portions of the layer of polycrystalline silicon and the layer of metal-silicide to thereby create a plurality of electrically isolated regions of polycrystalline silicon on metal-silicide; forming a layer of dielectric over at least all the thereby portions of metal-silicide; and fabricating regions of metal over at least part of the polycrystalline silicon, the metal-polycrystalline silicon interface forming a Schottky diode connected between the metal and the metal-silicide.

In a further embodiment, an array of Schottky diodes in a desired pattern comprises: a dielectric substrate; a plurality of first strips on the dielectric substrate, each strip including a lower region of metal-silicide and an upper region of polycrystalline silicon disposed over all of the metal-silicide; a first region of insulating material on each of the plurality of strips, the first region of insulating material covering the lower region of metal-silicide; a second region of insulation material on selected portions of the strips covering the polycrystalline silicon at those selected portions; a plurality of metal strips, each disposed to cross at least one of the plurality of first strips, the metal strip forming a Schottky diode wherever the metal contacts the upper region of polycrystalline silicon, and the metal strips not forming a Schottky diode wherever the metal contacts the second region of insulating material.

Schottky diodes formed according to the present invention provide significantly improved speed and density for read-only memory and programable logic arrays. The technique of this invention is adaptable to any existing bipolar or metaloxide silicon process, because the diode array is fabricated on an insulating substrate, for example, the field oxide. Only one additional mask is needed to incorporate the diode array of this invention in a standard integrated circuit manufacturing process.

DETAILED DESCRIPTION

Figure 1:
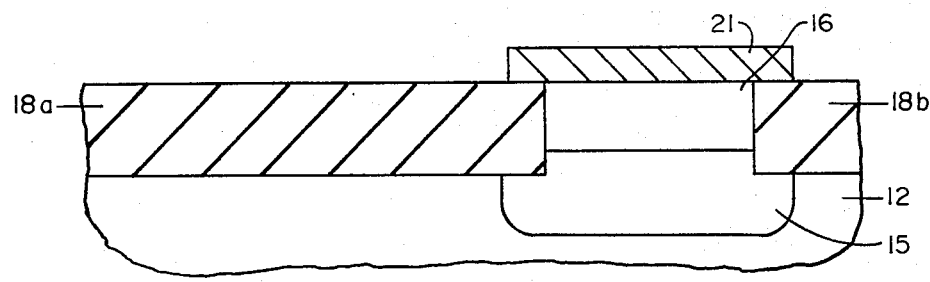
FIG. 1 is a cross-sectional view of an integrated circuit structure having field oxide and other regions.

FIG. 1 is a cross-sectional view of an integrated circuit structure which may be fabricated using a series of well-known steps. For example, the structure of FIG. 1 may be fabricated utilizing the techniques taught by Peltzer in U.S. Pat. No. 3,648,125 entitled "Method of Fabricating Integrated Circuits with Oxidized Isolation and the Resulting Structure." Briefly summarized, one technique taught by Peltzer for forming the structure depicted in FIG. 1 is to introduce N conductivity-type dopant 15 into a monocrystalline silicon substrate 12. A layer of epitaxial silicon 16 is then deposited on the surface of substrate 12. Desired regions of epitaxial material 16 are etched and oxidized to create field oxide regions 18a and 18b. A layer of silicon nitride 21 is next deposited across the upper surface of epitaxial silicon 16 and field oxide 18. Nitride 21 is then removed from undesired portions of the surface to create the structure depicted in FIG. 1. The purpose of silicon nitride layer 21 is to protect epitaxial silicon 16 from subsequent process operations depicted in FIGS. 2 through 4.

In each of FIGS. 1–6, the right-hand side of the figure is provided to illustrate the interaction of the process and structure of this invention with a conventional integrated circuit fabrication process. The Schottky diode array of this invention requires only an insulating substrate on which to deposit metal-silicide 24. In the preferred embodiment this insulating substrate comprises silicon dioxide formed on the upper surface of a semiconductor structure. In this manner an array of Schottky diodes may be fabricated in conjunction with active and/or passive electronic components, which components may be used in conjunction with the Schottky diode array. A typical integrated circuit structure is shown on the right-hand side of FIGS. 4–6.

Figure 2:
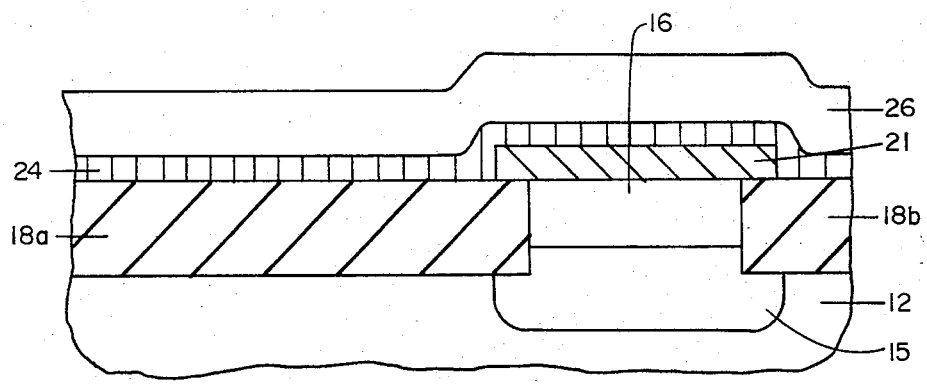
FIG. 2 is a subsequent cross-sectional view showing the appearance of the structure after formation of a layer of metal-silicide and a layer of polycrystalline silicon.

As next shown in FIG. 2, a layer 24 of metalsilicide is deposited across the upper surface of silicon dioxide 18 and silicon nitride 21. Because of their ability to resist subsequent high temperature process operations, refractory metal-silicides have been most desirable for fabricating layer 24, and in a preferred embodiment tantalum silicide has been used. In the preferred embodiment tantalum silicide was sputtered or evaporated onto the surface of the semiconductor structure using well-known process operations to a thickness of 2000 angstroms.

As also shown in FIG. 2, a layer of polycrystalline silicon 26 is deposited on top of metal-silicide 24, for example using known chemical vapor deposition technology. In the preferred embodiment polycrystalline silicon 26 will be deposited to a thickness of approximately 5000 angstroms. In the preferred embodiment laser annealing may be used to convert about the top 1000–2000 angstroms of polycrystalline silicon to monocrystalline silicon. Thus the subsequently formed Schottky diodes will have minimum current leakage.

Figure 9:
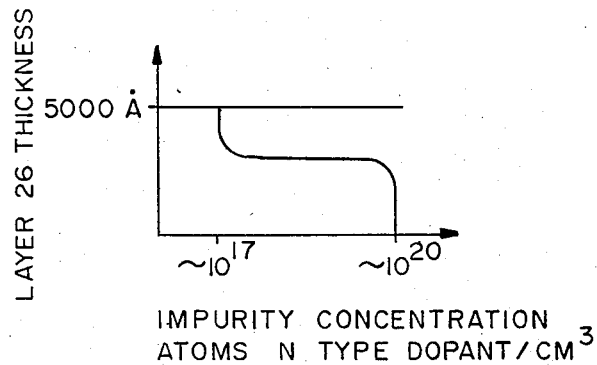
FIG. 9 is a typically graduated impurity concentration profile as used in the layer of polycrystalline silicon.

An N conductivity type impurity, typically phosphorus, is then implanted into polycrystalline silicon 26. This may be accomplished using well-known ion implantation technology. In the preferred embodiment, the ion implantation is controlled to produce a graduated impurity concentration within layer 26 as shown in FIG. 9. As shown in FIG. 9 at the upper surface of polycrystalline silicon 26 an impurity concentration of about $10^{17}$ or $10^{18}$ atoms of phosphorus per cubic centimeter of polycrystalline silicon is present. At the lower surface of layer 26, that is, where layer 26 contacts layer 24, the impurity concentration is increased to about $10^{20}$ atoms of phosphorus per cubic centimeter of polycrystalline silicon. The increased concentration of N conductivity type impurities at the interface between metal-silicide 24 and polycrystalline silicon 26 provides a substantially ohmic connection between the two layers.

Figure 3:
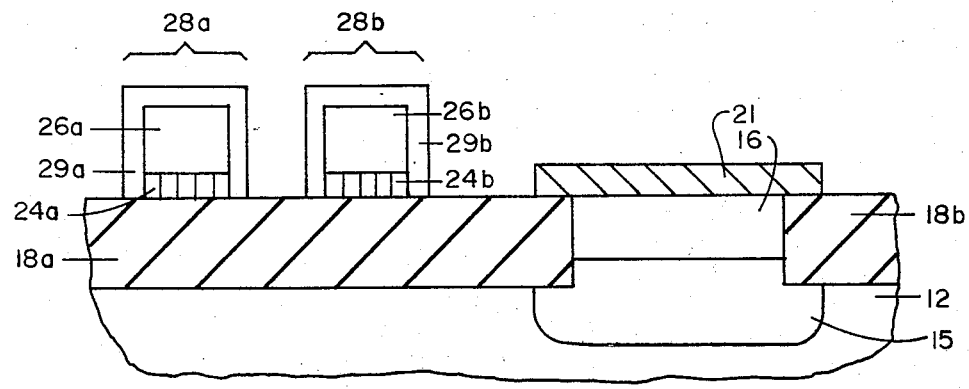
FIG. 3 is a subsequent cross-sectional view showing the appearance of the structure after undesired portions of the layers of metal-silicide and polycrystalline silicon have been removed, and the remaining portions oxidized.

Subsequent process operations are depicted in FIG. 3. As shown in FIG. 3, using known masking and etching techniques, undesired portions of polysilicon 26 and metalsilicide 24 are removed to create the structure shown in FIG. 3. In one embodiment this is accomplished by first thermally oxidizing layer 26 and layer 24 to create approximately 500 angstroms of silicon dioxide. A mask is then formed over layer 26 and plasma etching used to remove undesired portions of layers 24 and 26.

Although not shown in FIG. 3, in the preferred embodiment the resulting islands of the combined layers 24 and 26 are strips of material extending perpendicularly to the cross-section shown in FIG. 3. As will be described, subsequent strips of material will be formed perpendicular to strips 28a and 28b, and the intersections of these subsequently formed strips with strips 28a and 28b will form a matrix of Schottky diodes.

Following the etching process used to define strips 28a and 28b, these strips are again thermally oxidized to create approximately 1000 angstroms of silicon dioxide 29a and 29b on the side and top surfaces of strips 28a and 28b. As will be apparent, silicon dioxide regions 29a and 29b must cover at least all exposed regions of metal-silicide 24a and 24b to prevent these regions from forming short circuits with a subsequently deposited metal layer.

Following FIG. 3, silicon nitride layer 21 may be removed and any desired combination of well-known integrated circuit processing operations utilized to fabricate desired integrated circuit structures in epitaxial layer 16. For example, P and N conductivity-type impurities may be introduced to create the transistor structure depicted in FIGS. 4 and subsequent. Obviously, other known structures may also be created in epitaxial material 16, or elsewhere as desired in wafer 12. At the completion of the integrated circuit manufacturing process shown in FIG. 4, a region of silicon dioxide 32 remains on the surface of epitaxial material 16. Region 32 is not, in any way, necessitated by the invention, but is shown merely for illustration.

Figure 4:
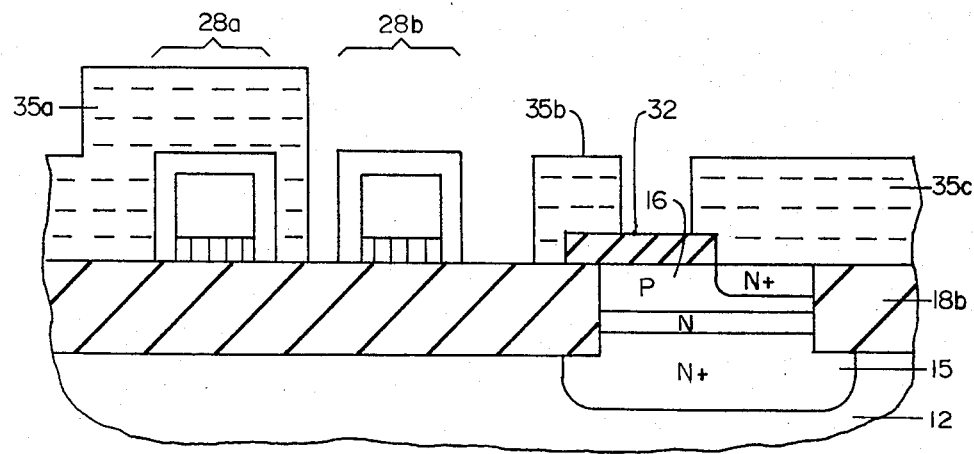
FIG. 4 is a subsequent cross-sectional view showing the appearance of the structure after photoresist has been deposited and defined.

As shown in FIG. 4, a layer of photoresist 35 is formed across the surface of the structure and selectively removed. In particular, photoresist 35 will be removed from the surface of any portion of any of the strips 28a, 28b, etc. where a Schottky diode is desired to be formed. For illustration, FIG. 4 shows a structure in which no Schottky diode is desired at the particular cross-section of strip 28a shown in FIG. 4, whereas a Schottky diode is desired at the particular cross-section of strip 28b shown in FIG. 4. At subsequent cross-sections of either of strips 28a and 28b, the photoresist 35 may be removed as desired. That is explained further in conjunction with FIG. 8. Photoresist 35 may also be removed from selected portions of the other regions of the integrated circuit structure. For example, as shown in FIG. 4, photoresist 35 has been removed from a portion of the surface of silicon dioxide 32 to enable subsequent fabrication of an electrical contact to epitaxial material 16.

Figure 5:
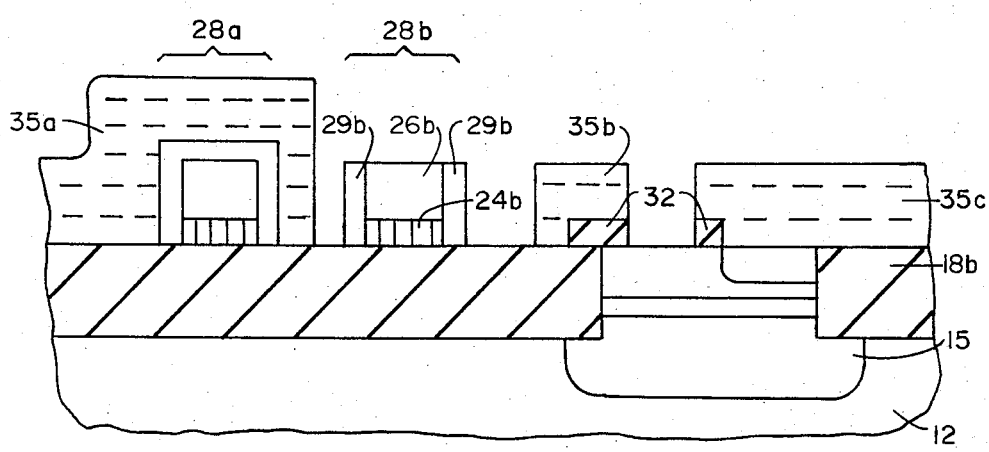
FIG. 5 is a subsequent cross-sectional view showing the appearance of the structure after plasma etching.

As shown in FIG. 5, the depicted structure is next anisotropically etched to remove only the silicon dioxide 29b from the upper surface of polycrystalline silicon 26b. The silicon dioxide 29b is not removed from the sides of polycrystalline silicon 26b or from the sides of metal-silicide 24b. At the same time silicon dioxide 29 is removed from the desired portions of strip 28b, it will also be removed from the surface of epitaxial material 16.

Figure 6:
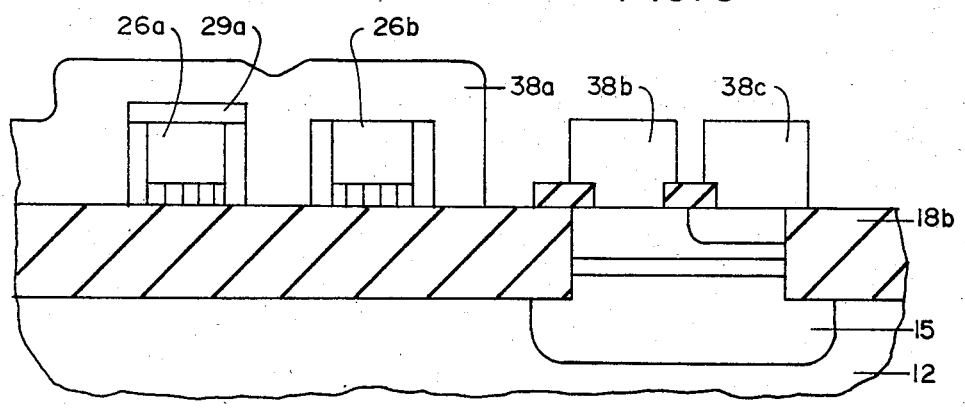
FIG. 6 is a subsequent cross-sectional view showing the appearance of the structure after formation of a layer of aluminum.

As shown in FIG. 6, a layer of metal 38 is deposited across the upper surface of the depicted structure and removed from undesired locations. In this manner electrical connections 38a, 38b, and 38c are created. In a preferred embodiment aluminum is evaporated onto the surface of the structure to create a metal layer 38 which is approximately 800 angstroms thick. Wherever metal 38a contacts polycrystalline silicon 26, for example, at strip 28b, a Schottky diode is created. In other regions, for example on strip 28a at the depicted cross-section, insulating material 29a prevents metal 38a from contacting polycrystalline silicon 26a, and thereby prevents formation of a Schottky diode.

Figure 7:
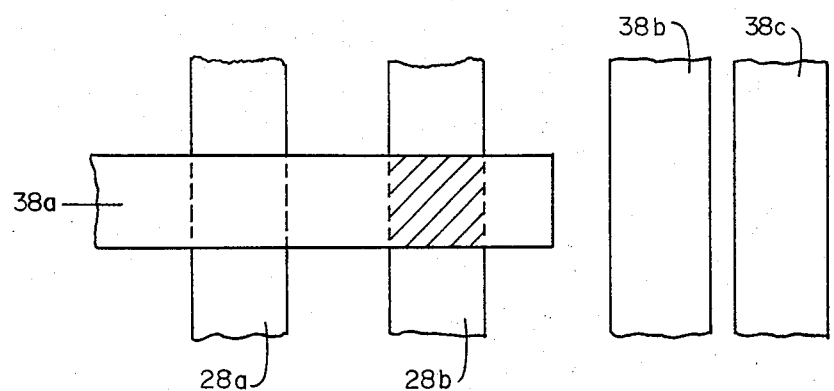
FIG. 7 is a top view of the structure shown in FIG. 6.

FIG. 7 is a top view of the cross-section shown in FIG. 6. Strips 28a and 28b are disposed perpendicularly to strip 38a. As previously discussed, strips 28a and 28b comprise polycrystalline silicon 26 and metal-silicide 24. Strip 38 is a metal. The intersection of strip 38a and 28b is shaded to indicate the Schottky diode fabricated at this location.

Figure 8:
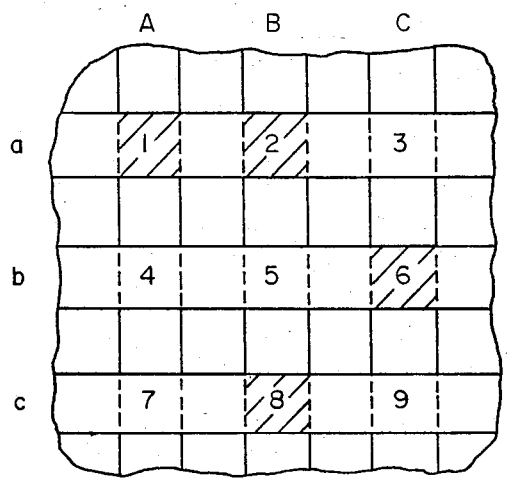
FIG. 8 is a top view of a portion of a large array of Schottky diodes fabricated according to the technique of this invention.

FIG. 8 shows a small portion of a larger array of Schottky diodes illustrating how the pressure or absence of Schottky diodes at various locations can create a read-only memory or programmable logic array. Where strips B and c intersect (location 8) a Schottky diode has been created. By applying well-known appropriate electrical signals to each of strips B and c, the presence of the Schottky diode at location 8 may be detected. Depending upon the particular application, the presence of the diode at location 8 may be construed as a 1 or a 0, while the absence of a diode at location 9 will be oppositely interpreted.

The process and structure of this invention results in the creation of Schottky diodes having reduced parasitic capacitance and higher operating speeds than prior art structures. The metal-silicide layer may have resistivities on the order of one ohm per square, which reduces the series resistance and improves the packing density of the structure. Using two micron layout rules, as many as a million bits may be fabricated on a chip 200 mils square. The process of the invention may be adapted to any standard bipolar or MOS processes in which insulating layers are created at the surface of an integrated circuit structue.

What is claimed is:

1. A Schottky diode comprising:
a substrate;
an insulating layer formed over said substrate;
a layer of metal silicide formed over said insulating layer;
a layer of polysilicon formed over said metal silicide and self-aligned with the edges thereof and in contact with said metal silicide;
a wall of insulating material formed over all exposed polysilicon and silicide surfaces except the entire top surface of said polysilicon; and
a layer of metal in contact with said top surface of said polysilicon.

2. A Schottky diode comprising:
a substrate;
a layer of metal silicide having sidewalls, said metal silicide overlying said substrate;
a layer of polysilicon having sidewalls and a top surface, said polysilicon overlying said silicide and aligned with the edges thereof and in contact with said metal silicide;
silicon dioxide spacers insulating all said sidewalls but not any part of said top surface; and
a Schottky contact to said top surface.

3. A Schottky diode for connecting metal to metal-silicide formed above a semiconductor substrate but insulated from it comprising:
(1) a dielectric layer on said substrate
(2) a layer of metal-silicide having an upper and a lower surface and having edges between said upper and lower surfaces, the lower surface being disposed on said dielectric layer;
(3) a layer of polycrystalline silicon having a top surface and side surfaces, said polycrystalline silicon aligned with said edges of the layer of metal-silicide and in contact with said metal-silicide;
(4) a region of insulating material disposed around the sides but not the top of said polycrystalline silicon and around said edges of said metal-silicide; and
(5) a layer of metal deposited over the entire structure so as to be in contact with the top of the layer of polycrystalline silicon.

4. A diode as in claim 3 wherein the layer of metal-silicide is a refractory metal-silicide.

5. A diode as in claim 4 wherein the metalsilicide is tantalum silicide.

6. A diode as in claim 3 wherein the layer of polycrystalline silicon is doped with an impurity.

7. A diode as in claim 6 wherein the impurity is introduced into the polycrystalline silicon nonuniformly.

8. The diode of claim 7 wherein said non-uniform doping is of a lesser concentration near said top of said polycrystalline silicon than in said polycrystalline silicon near said upper surface of said metal-silicide.

9. A diode as in claim 7 wherein the impurity is N conductivity-type.

10. A diode as in claim 3 wherein the region of insulating material comprises silicon dioxide.

11. A diode as in claim 3 wherein the layer of metal is aluminum.

12. An array of Schottky diodes in a desired pattern comprising:
a dielectric substrate;
a plurality of first strips on the dielectric substrate, each strip including a lower region of metal-silicide and an upper region of polycrystalline silicon aligned with the edges, of the metal-silicide and in contact with said metal-silicide, said first strips each having sides and a top;
a first region of insulating material on each of the plurality of strips covering said sides;
a second region of insulating material on selected portions of the tops of said first strips covering the polycrystalline silicon at those selected portions;
a plurality of metal strips, each disposed to cross at least one of the plurality of first strips, the metal strip forming a Schottky diode wherever the metal contacts the upper region of polycrystalline silicon, and the metal strip not forming a Schottky diode wherever the metal contacts only some or all of the second region of insulating material but not any of said polycrystalline silicon.

13. An array as in claim 12 wherein the dielectric substrate comprises silicon dioxide.

14. An array as in claim 13 wherein the dielectric substrate is formed on monocrystalline silicon.

15. An array as in claim 14 wherein the monocrystalline silicon includes other electronic devices.

16. An array as in claim 12 wherein the plurality of first strips is disposed perpendicularly to the plurality of metal strips.

17. An array as in claim 12 wherein the polycrystalline silicon is doped with an impurity.

18. An array as in claim 17 wherein the impurity is introduced into the polycrystalline silicon nonuniformly and has a higher concentration at the bottom of the layer of polycrystalline silicon than at the top of the layer of polycrystalline silicon.

19. An array as in claim 18 wherein the impurity is N conductivity type.

20. An array as in claim 12 wherein the first region of insulating material comprises silicon dioxide.

21. An array as in claim 20 wherein the second region of insulating material comprises silicon dioxide.

22. An array as in claim 12 wherein the plurality of metal strips comprise aluminum.

* * * * *